US006819584B2

(12) United States Patent
Noh (10) Patent No.: US 6,819,584 B2
(45) Date of Patent: Nov. 16, 2004

(54) NONVOLATILE FERROELECTRIC MEMORY DEVICE

(75) Inventor: Keum-Hwan Noh, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/612,987

(22) Filed: Jul. 7, 2003

(65) Prior Publication Data

US 2004/0114416 A1 Jun. 17, 2004

(30) Foreign Application Priority Data

Dec. 11, 2002 (KR) .......................................... 2002-78632

(51) Int. Cl.⁷ .............................................. G11C 11/22
(52) U.S. Cl. .................................. 365/145; 365/185.11
(58) Field of Search ............................. 365/145, 185.11

(56) References Cited

U.S. PATENT DOCUMENTS

| | | | |
|---|---|---|---|
| 5,828,615 A | 10/1998 | Mukunoki et al. | 365/210 |
| 5,953,277 A | 9/1999 | Mukunoki et al. | 365/210 |
| 6,067,265 A | 5/2000 | Mukunoki et al. | 365/210 |
| 6,510,072 B2 * | 1/2003 | Kang | 365/145 |
| 6,654,274 B2 * | 11/2003 | Kang et al. | 365/145 |
| 6,707,700 B2 * | 3/2004 | Kang | 365/145 |

FOREIGN PATENT DOCUMENTS

| | | | | |
|---|---|---|---|---|
| JP | 2001-307478 | 11/2001 | | G11C/11/22 |
| JP | 2002/015563 | 1/2002 | | G11C/11/22 |
| JP | 2003-132672 | 5/2003 | | G11C/11/22 |

* cited by examiner

Primary Examiner—M. Tran
(74) Attorney, Agent, or Firm—Piper Rudnick LLP (57) ABSTRACT

FeRAM and a method for generating a reference voltage are disclosed. The ferroelectric memory device includes: a memory cell unit having a plural memory cells equipping a ferroelectric capacitor and a first current gain transistor; a reference cell unit having a reference cell quipping a ferroelectric capacitor and a second current gain transistor; and a sense amp unit for comparing voltages, amplifying the voltage difference and outputting data, wherein a size of the two ferroelectric capacitor in the memory cell and the reference cell is identical and a size of the first current gain transistor and the second current gain transistor is different. As mentioned above, the present invention can generate a reference voltage by implementing different size of current gain transistors. Therefore, it can reduce time and cost to optimize a size of a ferroelectric capacitor for manufacturing high integrated 1T1C ReRAM.

4 Claims, 8 Drawing Sheets

NONVOLATILE FERROELECTRIC MEMORY DEVICE

FIELD OF THE INVENTION

The present invention relates to a nonvolatile ferroelectric random access memory; and, more particularly, to a method for generating a reference voltage in the ferroelectric random access memory of current gain cell mode.

DESCRIPTION OF RELATED ARTS

A ferroelectric random access memory FeRAM, which is nonvolatile ferroelectric memory, has been spotlighted as a memory device of next generation since the FeRAM has a same data processing speed of a dynamic random access memory DRAM and has a nonvolatile characteristic, which preserves data without electric power.

FeRAM has similar structure of DRAM. That is, it is a memory device including a unit cell having 1 transistor 1 capacitor (1T1C) structure, which means the unit cell is constructed with one transistor and one capacitor. Also, FeRAM includes a ferroelectric capacitor in order to use high remnant characteristic of the ferroelectric. By using ferroelectric capacitor, data can be preserved when an electric field is eliminated.

Figure 1:
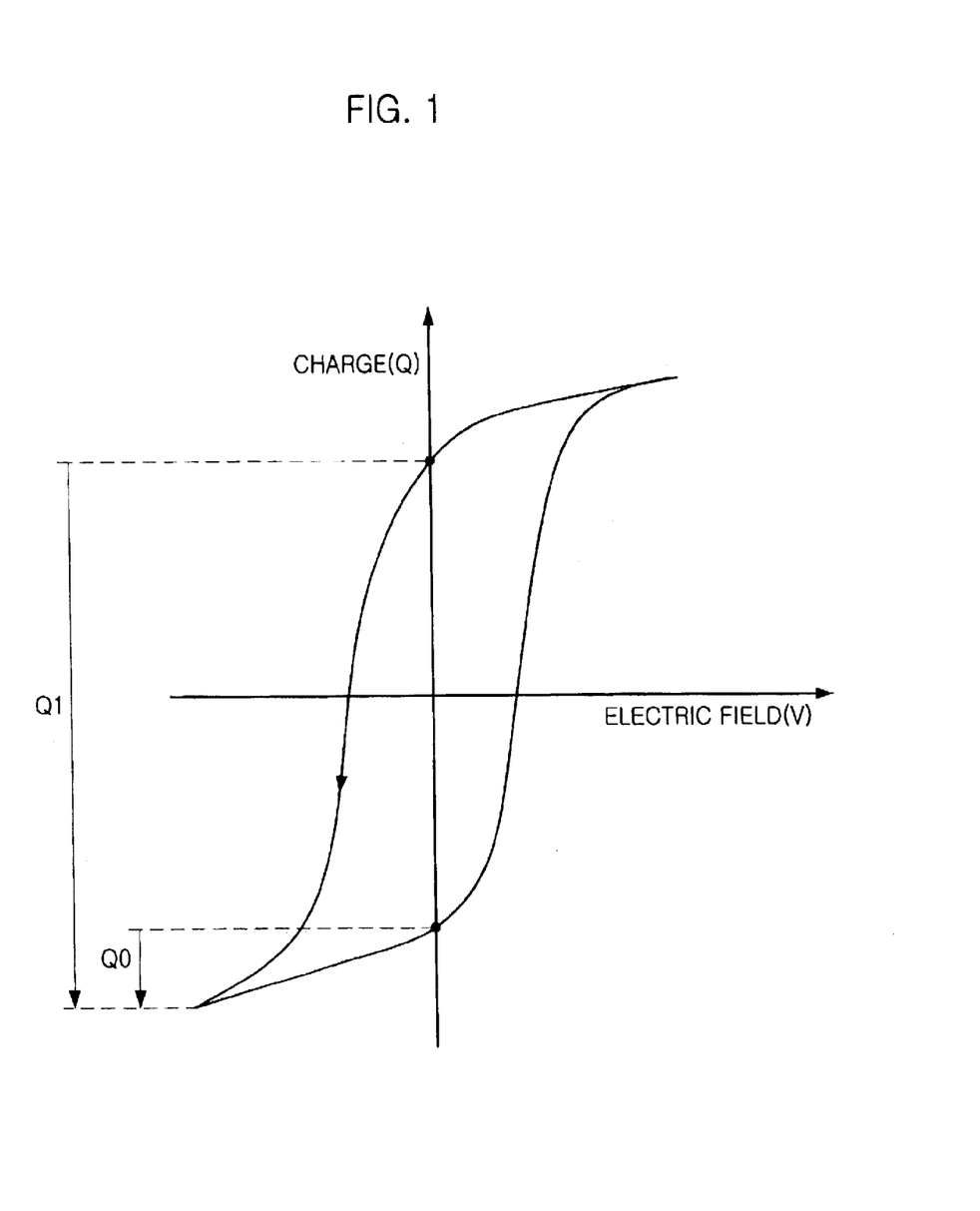
FIG. 1 is a graph showing a characteristic of hysteresis loop of a conventional ferroelectric.

FIG. 1 is a graph showing a characteristic of hysteresis loop of a conventional ferroelectric.

Referring to FIG. 1, although induced polarization eliminates the electric field, the electric field is not eliminated because of existence of remnant and a certain level of the electric field is maintained. The nonvolatile ferroelectric memory cell puts into practical use of a switching charge Q1 and non-switching charge Q0 of the ferroelectric for implementing a memory cell by mapping the Q1 to a logic '1' and the Q0 to a logic '0'.

Figure 2:
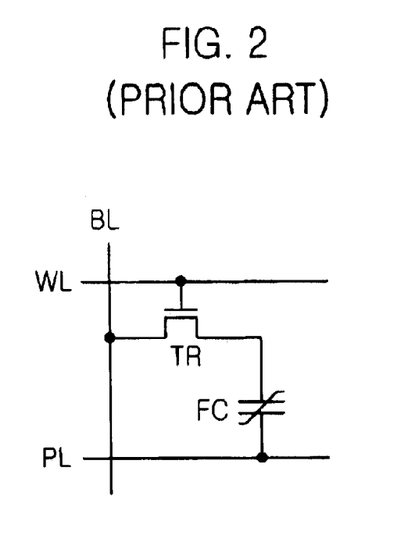
FIG. 2 is a circuit diagram illustrating a unit cell of conventional ferroelectric memory.

FIG. 2 is a circuit diagram illustrating a unit cell of conventional ferroelectric memory.

Referring to FIG. 2, the unit cell is formed by including a word line WL and a plate line PL formed in direction of row, a bit line formed in a direction of crossing the word line and plate line, a switching transistor TR having a gate connected to the word line WL, a-drain connected to the bit line BL, and a ferroelectric capacitor FC having one end connected to a source of the transistor TR, and another end connected to the plate line PL. A plurality of the above mentioned unit cells is constructed to a cell array unit.

In a mean time, for operating the ferroelectric memory, a reference voltage is required. For reading data stored in the unit cell, a data voltage transmitted to a main bit line BL needs to be compared with the reference voltage transmitted to a sub bit line /BL and to be amplified since the data voltage transmitted to the main bit line is so minute.

Figure 3A:
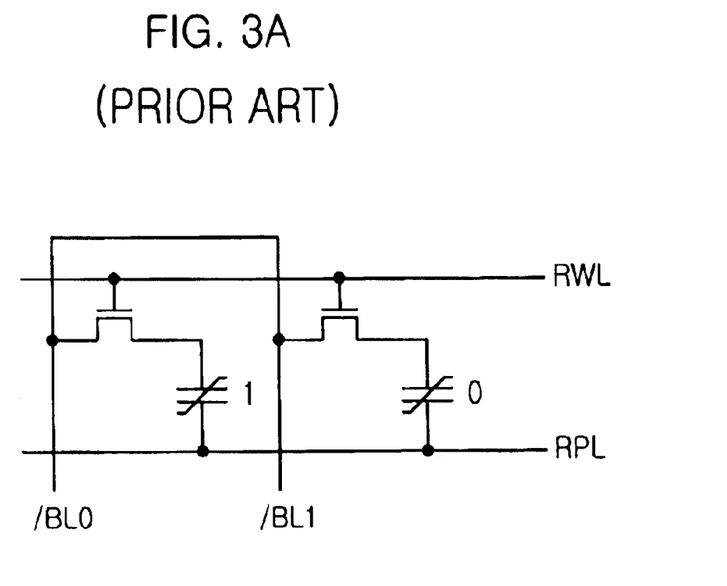
FIGS. 3A and 3B are circuit diagrams showing a conventional reference cell for generating a reference voltage in accordance with two different conventional methods.
Figure 3B:
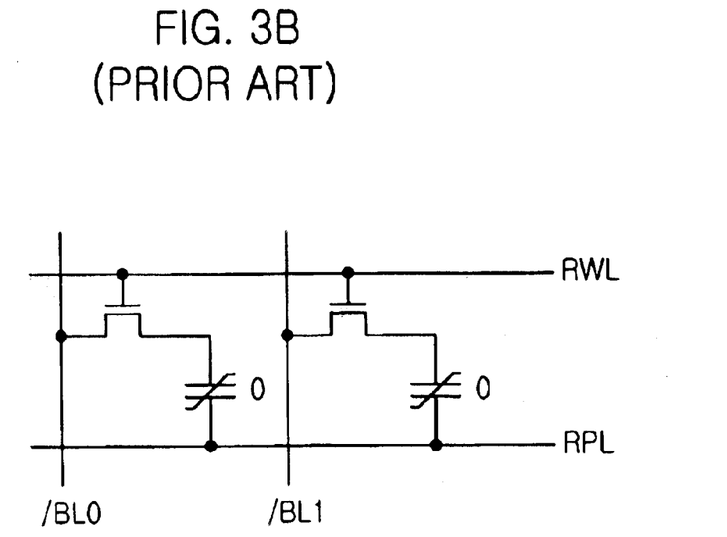

FIGS. 3A and 3B are circuit diagrams showing a conventional reference cell for generating a reference voltage in accordance with two different conventional methods.

Referring to FIG. 3A, the reference cell uses two cells having a ferroelectric capacitor, which is identical size of the capacitor in the memory cell, and a mean signal of a cell having data as '1' and other cell having data as '0' is used as a reference signal. In the FIG. 3A, RWL is a word line of the reference cell and RPL is a plate line of the reference cell.

The reference cell shown in FIG. 3A is required to have exact mean value of a cell having data as '1' and other cell having data as '0'. However, it is impossible to provide exact mean value since degradation speeds of switching charge and non-switching charge of the ferroelectric capacitor are different.

For overcoming the above mentioned problem of the reference cell in FIG. 3A, different size of ferroelectric capacitor is used in reference cell of FIG. 3B comparing to a ferroelectric capacitor in a memory cell. It shows method generating non-switching charge as a reference signal by using larger ferroelectric capacitor in the reference cell comparing to the ferroelectric capacitor used in the memory cell.

However, the larger size of ferroelectric capacitor in FIG. 3B is more influenced by the capacitor degradation. Thus, it is not reliable method.

Recently, a FeRAM of current gain cell having hierarchy bit line structure has been introduced for improving a data sensing margin.

However, there is not method introduced for optimal reference voltage by overcoming the above mentioned problems to be suitable to the FeRAM having the current gain cell mode.

SUMMARY OF THE INVENTION

It is, therefore, an object of the present invention to provide a ferroelectric random access memory FeRAM for data sensing with simple peripheral circuit while constraining variation of reference voltage caused by degradation of a ferroelectric capacitor by implementing an identical size of ferroelectric capacitor in a memory cell and a reference cell and different size of NMOS transistor as current gain transistor in a memory cell and a reference cell.

In accordance with an aspect of the present invention, there is provided a ferroelectric memory device, including: a memory cell unit having hierarchical bit-line structure formed by forming a word line and a plate line in a direction of a row and forming sub-bit line and main bit line in a direction of crossing the word line and the plate line, and including a plural memory cells equipping a ferroelectric capacitor coupled to the sub bit line and a first current gain transistor having a gate coupled to the sub bit line, one end connected to a ground, and other end connected to the main bit line; a reference cell unit having hierarchical bit line structure formed by forming a reference word line and reference plate line in a direction of a row and forming a reference sub bit line and a reference main bit line in a direction of crossing the reference word line and reference plate line, and including a reference cell quipping a ferroelectric capacitor coupled to the reference sub bit line and a second current gain transistor having a gate connected to the reference sub bit line, an one end connected to a ground power supplying end and another end connected to the reference main bit line; and a sense amp unit for comparing voltages of the main bit line of the memory cell unit and the reference main bit line of the reference cell unit, amplifying the voltage difference and outputting data, wherein a size of the two ferroelectric capacitor in the memory cell and the reference cell is identical and a size of the first current gain transistor and the second current gain transistor is different.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 4:
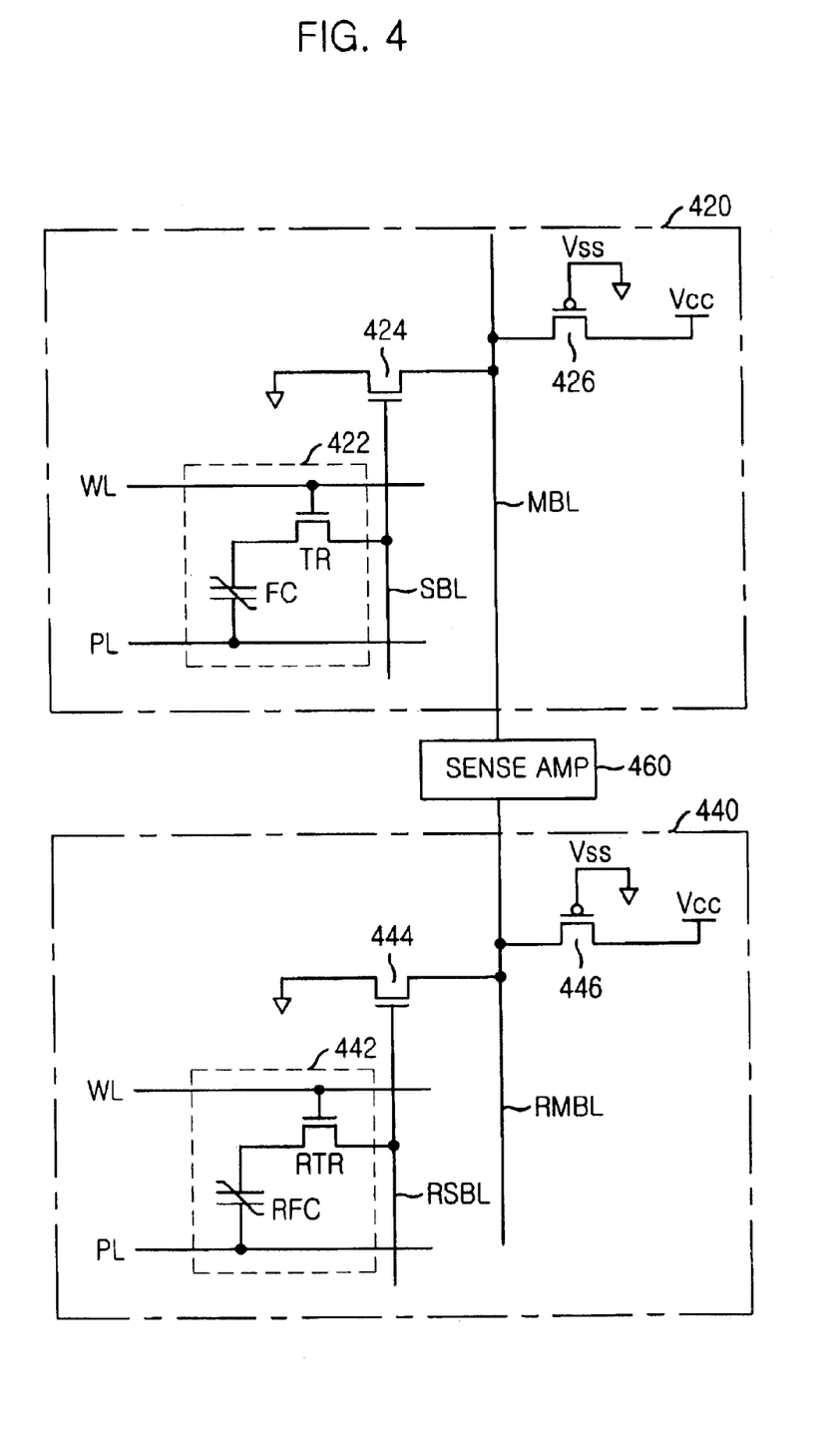
FIG. 4 is a circuit diagram illustrating a FeRAM of current gain cell mode in accordance with a preferred embodiment of the present invention.

FIG. 4 is a circuit diagram illustrating a FeRAM of current gain cell mode in accordance with a preferred embodiment of the present invention.

Referring to FIG. 4, the FeRAM of current gain cell mode includes a memory cell unit 420 having hierarchical bit line structure, a reference cell unit 440 for providing a reference voltage, and a sense amp unit 460 for outputting data by comparing a voltage of reference main bit line RMBL and a voltage of a main bit line MBL of the memory cell unit and amplifying a voltage difference.

The memory cell unit 420 has a hierarchical structure constructed by forming the word line WL and the plate line PL in a direction of row and forming the sub bit line SBL and main bit line MBL in direction of crossing the word line.

Also, the memory cell unit 420 includes a plural of memory cells 422 connected to the sub bit line SBL, a current gain transistor 424 having a gate connected to the sub bit line, a source (or drain) connected to a ground VSS, and a drain (or source) connected to the main bit line, and a main bit line sense load transistor 426 having a gate connected to the VSS, a source (or drain) connected to the main bit line, and a drain (or source) connected to a power supplier Vcc.

A unit memory cell 422 includes a switching transistor TR having a gate connected to the word line and a drain connected to the sub bit line, and a ferroelectric capacitor having one end connected to the source of the transistor TR and other end connected to the plate line PL. A plural of the above mentioned unit memory cells 422 is connected to the sub bit line SBL to construct the memory cell unit 420.

The reference cell unit 440 has a hierarchical bit line structure by forming a reference word line RWL and reference plate line RPL in a direction of row and forming a reference sub bit line and reference main bit line in a direction of crossing the reference word line RWL and the reference plate line.

Also, the reference cell unit 420 includes a plural of reference cells 442 connected to the reference bit line, a current gain transistor 444 having a gate connected to the reference sub bit line RSBL, a source (or drain) connected to a ground VSS and a drain (or source) connected to the reference main bit line and a reference main bit line sense load transistor 446 having a gate connected to the VSS, a source (or drain) connected to the reference main bit line RMBL and a drain (or source) connected to the Vcc.

The unit reference cell 422 includes a switching transistor TR having a gate connected to the reference word line RWL and a drain connected to reference sub bit line and a ferroelectric capacitor RFC having one end connected to a source of the transistor TR and another end connected to the reference plate line RPL. The reference cell unit 420 is constructed by connecting a plural of the above mentioned unit cells 422 to the reference sub bit line.

The current gain transistors 424 and 444 of the memory cell and the reference cell can be implemented by using NMOS and the sense load transistors 426 and 446 can be implemented by using a PMOS.

In the present invention, a size of the ferroelectric capacitor FC of the memory cell 422 and a size of the ferroelectric capacitor FC of the reference cell 442 are identical.

Also, in the present invention, a size of the current gain transistor 242 of the memory cell unit 420 and a size of the current gain transistor 424 of the reference cell unit 440 are different.

The present invention generates a mean voltage in the reference main bit line of a voltage $V_{RMBL"1"}$, which is corresponding to a logic "1" and a voltage $V_{RMBL"0"}$, which is a logic "0", as a reference voltage by controlling a size of the current gain transistor 424 of the reference cell unit 440. That is, the optimal reference voltage is generated by differently controlling a width and length of the current gain transistor 424 in the reference cell unit 440 comparing to the current gain transistor 424 in the memory cell unit 420.

Figure 5:
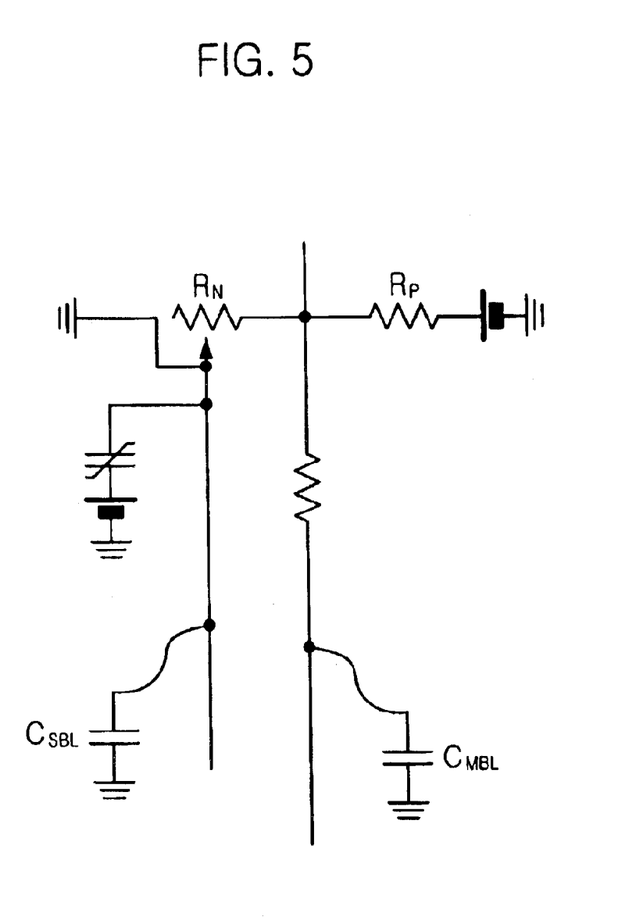
FIG. 5 is a circuit diagram of a reference cell unit in accordance with the present invention.

FIG. 5 is a circuit diagram of a reference cell unit in accordance with the present invention.

Referring to FIGS. 4 and 5, if a voltage is applied to the reference plate line RPL in the reference cell, a voltage of the reference sub bit line becomes the voltage $V_{RSBL"1"}$ corresponding to the logic "1" or the voltage $V_{RSBL"0"}$ corresponding to the logic "0" according to a state of storing data of the ferroelectric capacitor RFC.

A current flowing at the current gain transistor 444 is determined according to a voltage $V_{RSBL}$ of the reference sub bit line and a voltage $V_{RMBL}$ of the reference main bit line.

Since the reference main bit line is connected to the Vcc through PMOS, an amount of current flowing the load transistor 446 (PMOS) is determined by a size of the voltage $V_{RMBL}$ of the reference main bit line. Since two current $I_N$ and $I_P$ are same in a parallel state, the voltage of reference main bit line is determined when the two current becomes same.

Figure 6:
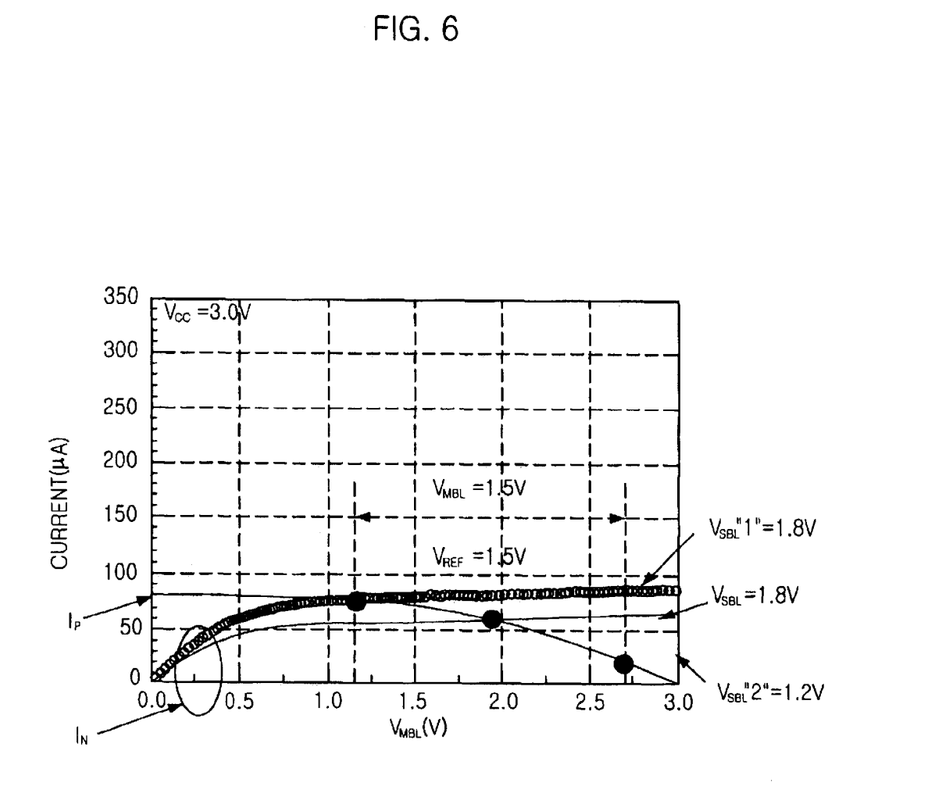
FIG. 6 is a graph showing a relation between the voltage of the sub bit line and a voltage of main bit line.

FIG. 6 is a graph showing a relation between the voltage of the sub bit line and a voltage of main bit line.

Referring to FIG. 6, a voltage of main bit line $V_{MBL}$ is determined when the current $I_N$ flowing at the current gain transistor and the current $I_P$ flowing at the load transistor IP becomes identical.

For example, in a case that the sub bit line voltage $V_{SBL"1"}$ is 1.8V when the ferroelectric capacitor is switched, the main bit line voltage $V_{MBL"1"}$ becomes 1.2V. Also, in a case that the sub bit line voltage $V_{SBL"0"}$ is 1.2V when the ferroelectric capacitor is non-switched, the main bit line voltage $V_{MBL"0"}$ becomes 2.7V.

Therefore, although a voltage difference $\Delta V_{SBL}$ of sub bit line voltages is 0.6V, a voltage difference $\Delta V_{MBL}$ of main bit line voltages is 1.5V. It clearly shows improvement of sensing margin, which is 2.5 times improved from the voltage difference. $\Delta V_{SBL}$ of sub bit line voltages.

In here, a reference voltage $V_{REF}$ between logic "1" and logic "0" is 1.9V, which becomes the optimal reference at 1.5V of $V_{SBL}$.

Figure 7A:
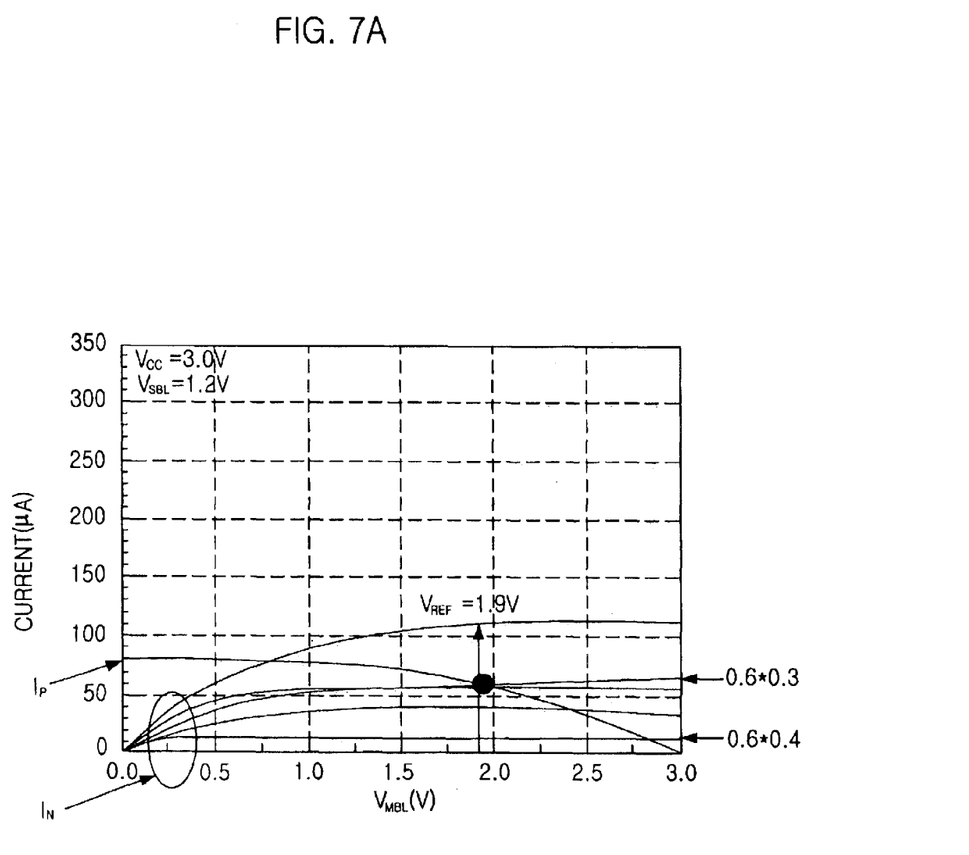
FIGS. 7A and 7B are graphs showing that optimal reference voltages generated according to a size of the current gain transistor in accordance with a preferred embodiment of the present invention.
Figure 7B:
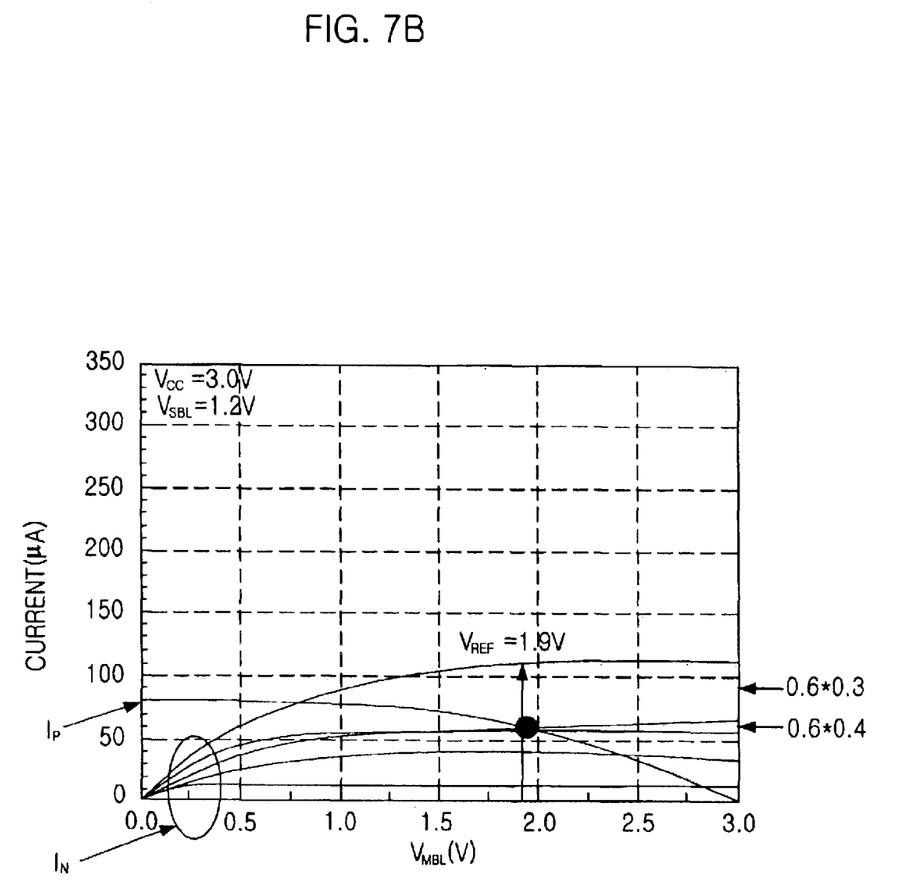

FIGS. 7A and 7B are graphs showing that optimal reference voltages generated according to a size of the current gain transistor in accordance with a preferred embodiment of the present invention.

An amount of current flowing the current gain transistor NMOS is increased in corresponding to increase of a width of the current gain transistor NMOS and is decreased in corresponding to increase of length of the current gain transistor NMOS.

FIG. 7A shows changes of reference voltage in a case of using non-switching charge of the ferroelectric capacitor by storing data '0' in the reference cell.

For gaining data showing in FIG. 7A, the current gain transistor 424 of FIG. 4 in the memory cell unit is set to a size of 0.6 (width)×0.3 (length) and the current gain transistor 444 of FIG. 4 in the reference cell unit is set to a size of 1.2 (width)×0.3 (length). The graph of FIG. 7A shows that if sizes of the current gain transistors are set according to above mentioned, the optimal reference voltage $V_{REF}$ is 1.9V.

FIG. 7B shows changes of reference voltage in a case of using a switching charge of the ferroelectric capacitor by storing data '1' in the reference cell.

For gaining data showing in FIG. 7A, the current gain transistor 424 of FIG. 4, in, the memory cell unit is set to a size of 0.6 (width)×0.3 (length) and the current gain transistor 444 of FIG. 4 in the reference cell unit is set to a size of 0.6 (width)×0.4 (length). The graph of FIG. 7A shows that if sizes of the current gain transistors are set according to above mentioned, the optimal reference voltage $V_{REF}$ is 1.9V.

As mentioned above, the present invention can generate stable and exact reference voltage by controlling and implementing different size of NMOS transistors, which is easy to obtain characteristics and stable to manufacture, as current gain transistors in a memory cell and a reference cell. Therefore, it can reduce time and cost to optimize a size of a ferroelectric capacitor in order to generate the reference voltage in conventional method for manufacturing high integrated one transistor one capacitor (1T1C) ferroelectric random access memory (FeRAM).

The present invention can increase a lifetime and reliability of FeRAM by constraining variation of reference signal caused by degradation comparing to a method using a signal corresponding to data '0' of a ferroelectric capacitor, which is much larger than a ferroelectric capacitor in a memory cell, as the reference signal.

The present invention can generate a reference signal by using only one cell instead of using a mean value of data 1 and data 0 in the conventional method. Therefore, the present invention requires simple circuit for generating the reference signal and it is convenience to generate the reference signal.

While the present invention has been described with respect to certain preferred embodiments, it will be apparent to those skilled in the art that various changes and modifications may be made without departing from the scope of the invention as defined in the following claims.

What is claimed is:

1. A ferroelectric memory device, comprising:

a memory cell unit having hierarchical bit-line structure formed by forming a word line and a plate line in a direction of a row and forming sub-bit line and main bit line in a direction of crossing the word line and the plate line, and including a plural memory cells equipping a ferroelectric capacitor coupled to the sub bit line and a first current gain transistor having a gate coupled to the sub bit line, one end connected to a ground, and other end connected to the main bit line;

a reference cell unit having hierarchical bit line structure formed by forming a reference word line and reference plate line in a direction of a row and forming a reference sub bit line and a reference main bit line in a direction of crossing the reference word line and reference plate line, and including a reference cell quipping a ferroelectric capacitor coupled to the reference sub bit line and a second current gain transistor having a gate connected to the reference sub bit line, an one end connected to a ground power supplying end and another end connected to the reference main bit line; and a sense amp unit for comparing voltages of the main bit line of the memory cell unit and the reference main bit line of the reference cell unit, amplifying the voltage difference and outputting data, wherein a size of the two ferroelectric capacitor in the memory cell and the reference cell is identical and a size of the first current gain transistor and the second current gain transistor is different.

2. The ferroelectric memory device as recited in claim 1, wherein the ferroelectric capacitor of the reference cell generates a reference voltage by using non-switching charge, the first and second current gain transistor are NMOS transistors, and a width of the second current gain transistor is wider comparing to the first current gain transistor.

3. The ferroelectric memory device as recited in claim 1, wherein the ferroelectric capacitor of the reference cell generates a reference voltage by using switching charge, the first and second current gain transistor are NMOS and a length of the second current gain transistor is longer comparing to the first current gain transistor.

4. The ferroelectric memory device as recited in claim 1, wherein the memory cell unit further includes a first load transistor having a gate connected to a ground, one end connected to the main bit line, and other end connected to the power supplier, and the reference cell unit further includes a second load transistor having a gate connected to the ground, one end connected to the reference main bit, and other end connected to the power supplier.

* * * * *